United States Patent [19]

Chu et al.

[11] 4,093,465
[45] June 6, 1978

[54] PHOTOSENSITIVE DIAZO CONDENSATE COMPOSITIONS

[75] Inventors: Simon L. Chu; Eugene Golda, both of Yonkers, N.Y.

[73] Assignee: Polychrome Corporation, Yonkers, N.Y.

[21] Appl. No.: 557,731

[22] Filed: Mar. 12, 1975

Related U.S. Application Data

[63] Continuation-in-part of Ser. No. 388,313, Aug. 14, 1973, abandoned, which is a continuation-in-part of Ser. No. 182,845, Sep. 22, 1971, abandoned, which is a continuation of Ser. No. 738,857, Jun. 21, 1968. abandoned.

[51] Int. Cl.² .................. G03C 1/52; G03C 1/70
[52] U.S. Cl. .................. 96/115 R; 96/33; 96/36; 96/36.2; 96/75.91 R
[58] Field of Search ............ 96/75, 91 R, 115 R, 96/93

[56] References Cited

U.S. PATENT DOCUMENTS

| 2,649,373 | 8/1953 | Neugebauer et al. | 96/75 |
| 2,679,498 | 5/1954 | Seven et al. | 96/91 R |
| 3,211,553 | 10/1965 | Ito | 96/75 |
| 3,353,984 | 11/1967 | Landau | 96/75 |
| 3,396,019 | 8/1968 | Uhlig | 96/75 |
| 3,396,020 | 8/1968 | Borchers | 96/75 |
| 3,679,419 | 7/1972 | Gillich | 96/75 |
| 3,836,366 | 9/1974 | Silver | 96/75 |
| 3,847,614 | 11/1974 | Mattor | 96/75 |
| 3,849,392 | 11/1975 | Steppan | 96/75 |

FOREIGN PATENT DOCUMENTS

| 1,280,885 | 7/1972 | United Kingdom | 96/75 |

OTHER PUBLICATIONS

Anon, "Research Disclosure," No. 116, pp. 94–99, 12/1973.
Kosor; J., "Light–Sensitive Systems," Wiley & Sons, 1975, pp. 52–54, 68–71 and 78–83.

Primary Examiner—Charles L. Bowers, Jr.

[57] ABSTRACT

Compositions comprising (I) solvent-soluble, negative-acting, light-sensitive reaction products of (a) water-soluble diazo condensation products with (b) water-insolubilizing inorganic compounds therefor and (II) synthetic, film-forming oleophilic resins, which compositions can be coated onto suitable base sheet materials to form presensitized lithographic printing plates, proofs for multi-color printing, visual aids, printed circuits and the like.

2 Claims, No Drawings

PHOTOSENSITIVE DIAZO CONDENSATE COMPOSITIONS

This application is a continuation-in-part application of copending application Ser. No. 388,313, filed Aug. 14, 1973, now abandoned, which in turn was a continuation-in-part of application Ser. No. 182,845, filed Sept. 22, 1971 now abandoned, which in turn was a continuation application of application Ser. No. 738,857, filed June 21, 1968, now abandoned.

This invention relates to light-sensitive resinous compositions that are especially suitable for many purposes, including making lithographic plates, multi-color proofs, visual aids and printed circuits, and more particularly to compositions containing a solvent-soluble light-sensitive, negative-acting diazo reaction product and an oleophilic synthetic resin that can be coated onto suitable base materials, such as lithographically or electro-conductively suitable metals, plastics such as polyester film and the like, exposed to light through a negative image transparency and developed with a totally or substantially totally aqeuous developer.

Among the numerous improvements and advantages provided by this invention are, briefly, the integration of a light-sensitive material and a long-lasting image- or object-forming material that can be applied as a single coating onto an appropriate base, which coating (1) can be developed on the base with relatively inexpensive, non-volatile, non-toxic, wholly or substantially wholly aqueous desensitizing or developing solutions, (2) has on the base substantially at least the shelf-life, storability, light-sensitivity and durability of, e.g., currently commercially pre-sensitized lithographic plates, and generally substantially longer press-life, (3) has increased light sensitivity, generally termed "speed," (4) requires no hand lacquering after development, (5) can be satisfactorily developed to form high quality, sharp, fine objective areas or images quickly and easily by relatively unskilled workers without undue care to avoid impairment, and (6) on a lithographic plate generally gives longer press runs than prior art plates.

A negative lithographic plate, to which this invention is mainly directed, is exposed to light through a negative transparency of the desired image. The light causes the exposed light-sensitive material, commonly a diazo compound, to harden the coating on the plate, making the exposed area insoluble to a desensitizing solution thereafter applied onto the plate for the purpose of removing the portion of the light-sensitive coating which, because it was protected from the light by the negative, was not hardened. The light-hardened surface of a negative plate, which should be oleophilic and compatible with the greasy printing ink, is called the "image area;" the surface from which the non-hardened light-sensitive coating is removed by the desensitizer is, or can be converted to, a hydrophilic surface having little affinity for the greasy ink and is called the "non-image" area.

A positive plate generally is one upon which the hydrophilic non-image area is formed in the portion of the light-sensitive coating exposed to light whereas the unexposed portion is either oleophilic or convertible to an oleophilic state to form the ink-receptive image area.

Several attempts have been made by others to prepare lithographic plates having coated thereon a resinous material capable of being formed into a desired image to serve as the ink-receptive printing surface. Such plates, however, have been either totally different from the ones of this invention or commercially unacceptable or both.

It is an object of this invention to provide a light-sensitive resinous composition suitable for forming an image or an object area on a suitable base. Another object of this invention is to provide such a composition for coating onto a lithographic printing plate to form an improved presensitized plate. It is also an object of this invention to provide a lithographic printing plate that has an abrasion-resistant and wear-resistant oleophilic resinous image-forming surface and long presslife. A further object of this invention is to provide a presensitized negative-acting lithographic printing plate that has a light-sensitive resinous coating adapted to form, upon exposure to light, an ink-receptive image printing area, which plate is stable to ordinary ambient heat and humidity conditions during storage for protracted periods of time. Another object of this invention is to provide a lithographic printing plate having a light-sensitive resinous coating which is more sensitive to light, capable of forming an oleophilic image area that is long-running and has good abrasion-resistance, which plate, after exposure to light through a negative transparency, can be developed with a totally aqueous or substantially totally aqueous developer medium that removes the light-sensitive resinous coating from areas unexposed to light, and which plate requires no hand lacquering or other treatment of the resinous image surface. Still another object of this invention is to provide a light-sensitive resinous composition for coating onto suitable base sheets that can then be used, by exposure to light, development and further treatment as might be necessary, to make a variety of useful articles, for example visual aids, proofs in advance of multi-color printing and printed circuits. These and other objects of this invention will be in part discussed in and in part apparent from the following more detailed disclosure.

Broadly, the instant invention involves compositions containing (I) a solvent-soluble, negative-acting, light-sensitive component that is a reaction product of commonly used negative-acting lithographic diazo compounds with water-insolubilizing inorganic compounds reactable therewith that do not materially impair the light-sensitivity of the diazo, and (II) a synthetic organic resin that is essentially water-insoluble and oleophilic in character. Such compositions can be coated onto suitable bases, such as matals and plastics, from an essentially organic solvent medium to form, for example, storage-stable presensitized lithographic plates or printed circuit boards. After light exposure of the coated bases, the light-unexposed areas of the coated resinous composition can be removed with a completely or substantially completely aqueous developer that acts upon the bond between the light-sensitive reaction product in the coating and the underlying base material to loosen that bond, and thereby remove the coating composition in the unexposed area. The light, however, causes reaction of the reaction product to render the resinous coating composition in the exposed areas insensitive to the loosening action of the developer. Plates and other articles according to this invention exhibit greater light sensitivity in the presensitized state, and after exposure and development are characterized by unusually good to exceptional stability during storage and subsequent handling and usage, such as press runs, to such known common deteriorating factors during storage, as moisture, heat and "dark reaction," and during use, as abrasion, decrease of oleophilicity, wear and weakening of mechanical strength. Fine, sharp, clear images or objects can be formed on the coated bases to make high quality, accurate printed circuits, color proofs, visual aids and, in the case of lithographic plates, great numbers of excellent quality reproductions.

Virtually any material known and commonly used as a lithographic base surface for printing plates presently appears possible to use as a base on which to coat and use the light-sensitive resinous compositions of this invention. Such lithographic base surfaces include those made from paper, from synthetic resins and, especially in the case of long-running, dimensionally stable plates, from metals. Of the commonly used metals such as steel, zinc, aluminum, copper and chromium, sheets made of aluminum are preferred for a variety of reasons known in the art. Before applying the composition of the invention to the base, which desirably is in sheet form, the base can be treated in ways known to the art to enhance its character as a lithographic surface. For example, a metal plate can be grained either mechanically or chemically, e.g., as disclosed in U.S. Pat. No. 2,882,153 and No. 2,882,154, to enable better bonding of the coating applied onto it. An aluminum sheet can be anodized electrolytically to form a harder, more wear-resistant and abrasion-resistant surface, e.g., as disclosed in U.S. Pat. No. 3,440,050 and copending application Ser. No. 670,403 filed Sept. 25, 1967. These and other methods of treating lithographic base sheets are known in the art and can be utilized, as might be desired or advantageous, along with the compositions of this invention.

In general the diazo compounds for making the reaction product component of the instant light-sensitive resinous coating compositions are the water-soluble, negative-acting, light-sensitive diazos known and commonly used in the lithographic art. Such diazo compounds, broadly, are diazo-aromatics, and more particularly are diazo-arylamines that can be substituted on the aromatic nucleus or on the amino-nitrogen, preferably p-diazo-diphenylamine and derivates thereof, for example, condensation products thereof with organic condensing agents containing reactive carbonyl groups such as aldehydes and acetals, particularly condensates with compounds such as formaldehyde zinc chloride and paraformaldehyde. The preparation of such eminently suitable condensation products is disclosed in U.S. Pat. Nos. 2,922,715 and 2,946,683.

The foregoing diazo compounds are reacted with about an equimolar amount of a suitable inorganic compounds to prepare reaction products that are at least partially soluble in organic solvents, preferably well soluble, and that have light-sensitivity not substantially less than the starting diazo. The reaction products are only slightly water-soluble, if at all. Broadly suitable inorganic compound reactants are essentially those inorganic compounds that react with the water-soluble diazo compounds to reduce its ionic character and make it more covalent, do not reduce significantly its light-sensitivity, and produce a reaction product that is soluble in organic solvents but no more than only slightly water-soluble. Such inorganic compound reactants in general include such inorganic acids, as fluoroboric acid and phosphotungstic acid; inorganic chromate compounds, such as alkali metal chromates, for example, potassium chromate, and alkali metal dichromates, for example potassium dichromate; and inorganic thiocyanate compounds, for example, alkali metal thiocyanates, such as potassium thiocyanate. Particularly suitable inorganic compounds of the type described above include fluoroboric acid, phosphotungstic acid, alkali metal chromates and dichromates, such as potassium chromate and potassium dichromate, and alkali metal thiocyanates, such as potassium thiocyanate.

The diazo component and the inorganic compound reactant preferably are reacted together in approximately equimolecular quantities to form the diazo reaction products.

Synthetic resins with which the solvent-soluble, light-sensitive diazo reaction products described previously can be incorporated to form the coating compositions for making plates and articles according to this invention include many of the resins commonly known and used in other arts, and particularly those set forth in copending prior filed U.S. Pat. application Ser. No. 388,313, filed Aug. 14, 1973.

As will be noted from the examples which follow, the resins have a high enough molecular weight that there is no solubility-differential between the exposed image areas and the non-exposed, non-image areas. The resins also are such that when used in the compositions of this invention they result in a light-sensitive composition which may be developed by substantially aqueous developers. The resins also are such that when used in the compositions of this invention, they form a tack-free continuous surface.

A solvent is used to incorporate the resin and the light-sensitive diazo reaction product, and to coat them as an integral composition onto an appropriate base sheet to form an article of the invention, e.g., a presensitized lithographic plate. A suitable solvent desirably should dissolve both the resin and the diazo reaction product at least to an extent that a commercially practical coating solution is formed, a solution in which the resin and diazo reaction product are compatibly retained in the proportions desired for the coating subsequently to be formed on a base sheet from the solution. Organic solvents are needed to dissolve the resins. As pointed out previously, the light-sensitive diazo reaction product also is soluble in organic solvent, the extent of solubility often depending upon the specific solvent. Many common organic solvents sufficiently dissolve both the resin and the diazo reaction product; certain solvents are especially advantageous for making coating solutions of specific combinations of a resin and a diazo reaction product. Additional flexibility in the choice of coating solvents can be obtained by using a miscible, organic-aqueous co-solvent. Such a medium is essentially an organic one that can contain about 10% to about 25% of water, and in some instances up to about 35% water, depending upon the organic component and the resin.

Practical organic solvents, which are thus presently preferred according to this invention, include glycol ethers such as Methyl Cellosolve sold by Union Carbide Corporation under the tradename methyl Cellosolve, ketones such as acetone, ethers such as trioxane, heterocyclics such as furfuryl alcohol, N-methyl-pyrrolidine and N-methyl-pyrrolidone, and dimethylformamide. The Methyl Cellosolve is a particularly suitable solvent to use, both alone and along with up to about 30% of water. Acetone, dioxane, ethanol and methanol also are satisfactory solvents that can be used with up to about 35% of water, preferably about 25% to about 35% of water with dioxane, about 15% to about 20% of water with acetone, up to about 20% of water with methanol, and up to about 10% of water with ethanol.

Varying relative amounts of resin and diazo reaction product can be incorporated into the coating composition.

In general, it presently appears possible to make useful articles with the resin-diazo compositions of this invention containing as much as about 40 parts by weight of either component per part of the other. A more practical and desirable range is between about 10 parts by weight of either component per part of the other.

More specifically, the broadly preferred proportion of the coating composition components ranges from about two parts by weight of resin per part by weight of diazo reaction product to about six parts of diazo per part of resin, and desirably the composition contains at least as much of the diazo component as resin. The optimum proportion for a specific type of article, for instance a particular lithographic plate, of course, depends on the specific resin, diazo reaction product and base sheet. For example, on a grained aluminum base sheet about three to about four parts of diazo component per part of resin appears to give better results, about five to about six parts of diazo component per part of resin seems better on an anodized aluminum base, and a cleaned aluminum sheet, untreated except with an intermediate bonding layer former, can be utilized with about one to about two parts of diazo per part of resin. If an aqueous developer containing a small amount of an organic solvent is to be used, the amount of resin in the above proportions can be increased somewhat relative to the amount of diazo reaction product.

The amount of the resin-diazo reaction product coating composition, and thus the thickness of the ultimate image or object area on the article or plate, varies. Coatings in an amount of from about 25 milligrams to about 250 milligrams per square foot (msf) of base sheet surface have been found to provide satisfactory results. A preferred range is about 75 msf to about 150 msf of the resin-diazo reaction product composition.

A presensitized lithographic plate or other article made as described above is exposed to light through a negative image transparency to react the light-sensitive diazo reaction product in the resin-diazo coating on the plate. The area exposed, of course, is the object or image portion, and the coating composition in the unexposed non-object or non-image area is removed by developing the plate. The methods and means of exposing the plate are those well known and commonly used in the lithographic art. The diazo reaction product reacts, loses its light-sensitivity and forms a hardened product that chemically and/or mechanically binds it with the resin and much more firmly to the underlying base.

The unexposed areas, however, remain unreacted and are removed by a completely or substantially completely aqueous developing solution, as described above. It has been found that water alone is capable of developing some of the plates or articles of this invention. To facilitate development it is also possible to include in the water a wetting agent that more readily enables the water to penetrate the resin-diazo composition of the coating, loosen the unexposed diazo reaction product from the base and thereby remove the coating in the unexposed area. Particular wetting agents to be used generally depend upon the resin in the coating composition and are described in copending application Ser. No. 388,313, filed Aug. 14, 1973.

It is also possible to use a small amount of an organic solvent in the aqueous developer, particularly to develop plates coated with a composition containing a relatively large proportion of resin to diazo reaction product as described in copending application Ser. No. 388,313, filed Aug. 14, 1973.

The following Examples are illustrative of the invention.

EXAMPLE 1

To 50 ml of water is added 1 gm. of the light-sensitive diazo reaction product of the approximately equimolar condensation product of p-diazo-diphenylamine and paraformaldehyde (described in U.S. Pat. Nos. 2,922,715 and 2,946,683). To 50 ml of water is added 1 gm. of potassium thiocyanate. The resultant solutions are then thoroughly admixed until a precipitate is formed. The resultant reaction mixture is then filtered and the precipitate is dried in vacuo. The resultant precipitate is then dissolved in a solution comprised of 25 ml of methyl cellosolve, 15 ml of ethylene dichloride, 10 ml of methanol and 6 ml of dimethylformamid to which was added 0.2 gm. of an epoxy resin sold by the Shell Chemical Company under the tradename Epon 1031. A dye, 0.01 gm., of Basic Blue 6G, available from L & R Dyestuffs Corp., New York, N.Y., may then be added to the solution so that the coating and subsequent image can be easily seen by the worker. The solution is then coated onto an aluminum sheet, which previously is cleaned and degreased in a solution of trisodium phosphate and then in a solution of sulfuric acid and chromic acid, as is well known in the art. The coating solution is dried to form a thin coat of about 120 msf of the epoxy resin-diazo reaction product composition. The presensitized lithographic plate thus formed is exposed to light in a NuArc plate maker for about 1 minute through a negative transparency, and is then developed with an aqueous based developer composition, available from Polychrome Corporation, under the tradename Chromeguide 160. The lithographic plate thus prepared is of high quality, the image being accurately formed thereon, can be placed on an offset press without further treatment, and has a long presslife.

EXAMPLE 2

The procedure of claim 1 was followed except that equivalent amounts of potassium chromate, potassium dichromate, fluoroboric acid and phosphotungstic acid are substituted for the potassium thiocyanate with like satisfactory results being obtained.

The invention may be variously otherwise embodied within the scope of the appended claims.

What is claimed is:

1. A light sensitive, solvent soluble, oleophilic film forming composition, which comprises:
   A. A light sensitive, light hardenable, organic solvent soluble, substantially water-insoluble reaction product of:
      1. A water-soluble, light sensitive condensation product of:
         a. A negative acting diazonium salt of diphenylamine; and
         b. An organic reactive carbonyl-containing condensing compound therefore; with
      2. About an equimolar amount of a water insolubilizing alkali metal thiocyanate; and
   B. An organic solvent soluble, substantially water insoluble epoxy resin; said composition capable of being coated onto a base sheet from solution in an organic solvent or substantially organic solvent medium to form a tack-free continuous surface; exposed to light in a predetermined area to harden the coating in such area; and removed from unexposed area by an aqueous or substantially aqueous developer.

2. The composition of claim 1, wherein the inorganic compound is potassium thiocyanate.

* * * * *